United States Patent
Coffman et al.

Patent Number: 5,491,809
Date of Patent: Feb. 13, 1996

[54] SMART ERASE ALGORITHM WITH SECURE SCHEME FOR FLASH EPROMS

[75] Inventors: Tim M. Coffman, Sugarland; Sung-Wei Lin, Houston, both of Tex.; T. Damodar Reddy, Nalgonda, Ind.

[73] Assignee: Texas Instruments Incorporated, Dallas, Tex.

[21] Appl. No.: 764

[22] Filed: Jan. 5, 1993

[51] Int. Cl.⁶ .................................................. G06F 12/16
[52] U.S. Cl. .................. 395/430; 364/244.6; 364/246.7; 364/249.3; 364/954.3; 364/965.76; 364/965.79; 364/969; 364/DIG. 1; 364/DIG. 2; 365/218
[58] Field of Search ............ 395/425; 364/200 MS File, 364/900 MS File, 189.05; 365/218

[56] References Cited

U.S. PATENT DOCUMENTS

| | | | |
|---|---|---|---|
| 4,698,787 | 10/1987 | Mukherjee et al. | 365/185 |
| 5,043,940 | 8/1991 | Harari | 365/168 |
| 5,268,870 | 12/1993 | Harari | 365/218 |
| 5,270,979 | 12/1993 | Harari et al. | 365/218 |
| 5,270,980 | 12/1993 | Pathak et al. | 365/218 |
| 5,293,560 | 3/1994 | Harari | 365/185 |
| 5,297,148 | 3/1994 | Harari et al. | 371/10.2 |
| 5,333,300 | 7/1994 | Fandrich | 395/550 |
| 5,337,281 | 8/1994 | Kobayashi et al. | 365/218 |
| 5,341,339 | 8/1994 | Wells | 365/218 |
| 5,347,489 | 9/1994 | Merchant et al. | 365/203 |
| 5,355,464 | 10/1994 | Fandrich et al. | 395/425 |
| 5,357,475 | 10/1994 | Hasbun et al. | 365/218 |

OTHER PUBLICATIONS

"A Single Transistor EEPROM Cell and its Implementation in a 512K CMOS EEPROM", S. Mukherjee et al, IEDM 1985, pp. 616–619.

"A 9ons 100K Erase/Program Cycle Megabit Flash Memory", V. Kynett et al, ISSCC 1989, pp. 140–141.

*Primary Examiner*—Tod R. Swann
*Assistant Examiner*—Frank J. Asta
*Attorney, Agent, or Firm*—Theodore D. Lindgren; Leo N. Heiting; Richard L. Donaldson

[57] ABSTRACT

A method for erasing blocks of a non-volatile memory includes detecting whether a block is in at least one of an erased state or a state secured from erasure; then setting a flag register at a first level for each block detected to be in at least one of an erased state or a state secured from erasure or at a second level for each block not so detected; then selecting for erasure blocks that have their respective flags set at the second level; and then erasing the selected blocks.

5 Claims, 6 Drawing Sheets

SMART ERASE ALGORITHM WITH SECURE SCHEME FOR FLASH EPROMS

BACKGROUND AND SUMMARY OF THE INVENTION

This invention relates to computer systems which use non-volatile memories. More particularly, it relates to non-volatile memories which can be erased by erasing blocks, or sectors, of memory cells, rather than just erasing one cell at a time. One type of a non-volatile memory which is block erasable is called a flash EPROM or EEPROM.

Flash EPROMs employing single-transistor memory cells, using hot-carrier injection for programming and Fowler-Nordheim tunnelling for erasure are described, for example, in: (a) "A Single Transistor EEPROM cell and its implementation in a 512K CMOS EEPROM," S. Mukherjee et al., IEDM 1985 (p. 616–619) and in (b) "A 90ns 100K Erase/Program Cycle Megabit Flash Memory," V. Kynett et al., ISSCC 1989 (p. 140–141). The topic of reference (a) is also discussed in U.S. Pat. No. 4,698,787, which is incorporated herein by reference.

As the number of cells increases for the same physical size of a silicon chip, such EPROM's are called high density.

For high density flash EPROMs, the trend is towards sectored architecture for arrays so that flash erase can be done on either individual blocks or the complete array.

Erasure in flash EPROM's is generally accomplished by first programing, preconditioning, all the cells in a block of cells, and then erasing all those same cells. This action is taken without regard to whether the block of cells is in an erased state.

Over-erasure is a major problem in flash EPROM devices. If an erased cell receives too many erase pulses, it might go into depletion. Once a memory cell is depleted, it will conduct current even with zero voltage on its gate, and will be hard or even impossible to program due to current sharing by depleted cells on the same column (bitline).

Another problem in flash EPROM devices is low endurance. Endurance refers to the number of times a cell can be programmed or erased before it malfunctions. Currently, flash EPROMs must be erase preconditioned before they can be erased. The number of cycles possible to write and then erase a flash EPROM is limited. When the limit is reached, the memory cell will remain in one state; it can not be switched to a different state.

The erase cycle time has been unnecessarily long because existing erase methods do not discriminate between blocks of cells which need to be preconditioned/erased and those which have already been erased.

SUMMARY OF THE INVENTION

The invention overcomes the above-noted and other deficiencies of the prior art by providing a method and apparatus for eliminating or minimizing unnecessary erasing of blocks of cells. The invention eliminates the undesirable feature common to existing devices wherein the memory cells are over-erased, their life spans are shortened by unnecessary erase cycles, and the erase time is unnecessarily long. The invention is the first method of block erasure which detects and remembers the state of blocks of memory cells for use in selecting which blocks of memory cells to erase. Another feature of the invention is that a block of memory cells can be secured, so that its state can not be altered.

BRIEF DESCRIPTION OF THE DRAWINGS

The above-noted and other aspects of the present invention will become more apparent from a description of the preferred embodiment when read in conjunction with the accompanying drawings. The drawings illustrate the preferred embodiment of the invention. In the drawings the same members have the same reference numerals.

DESCRIPTION OF THE PREFERRED EMBODIMENT

Figure 1:
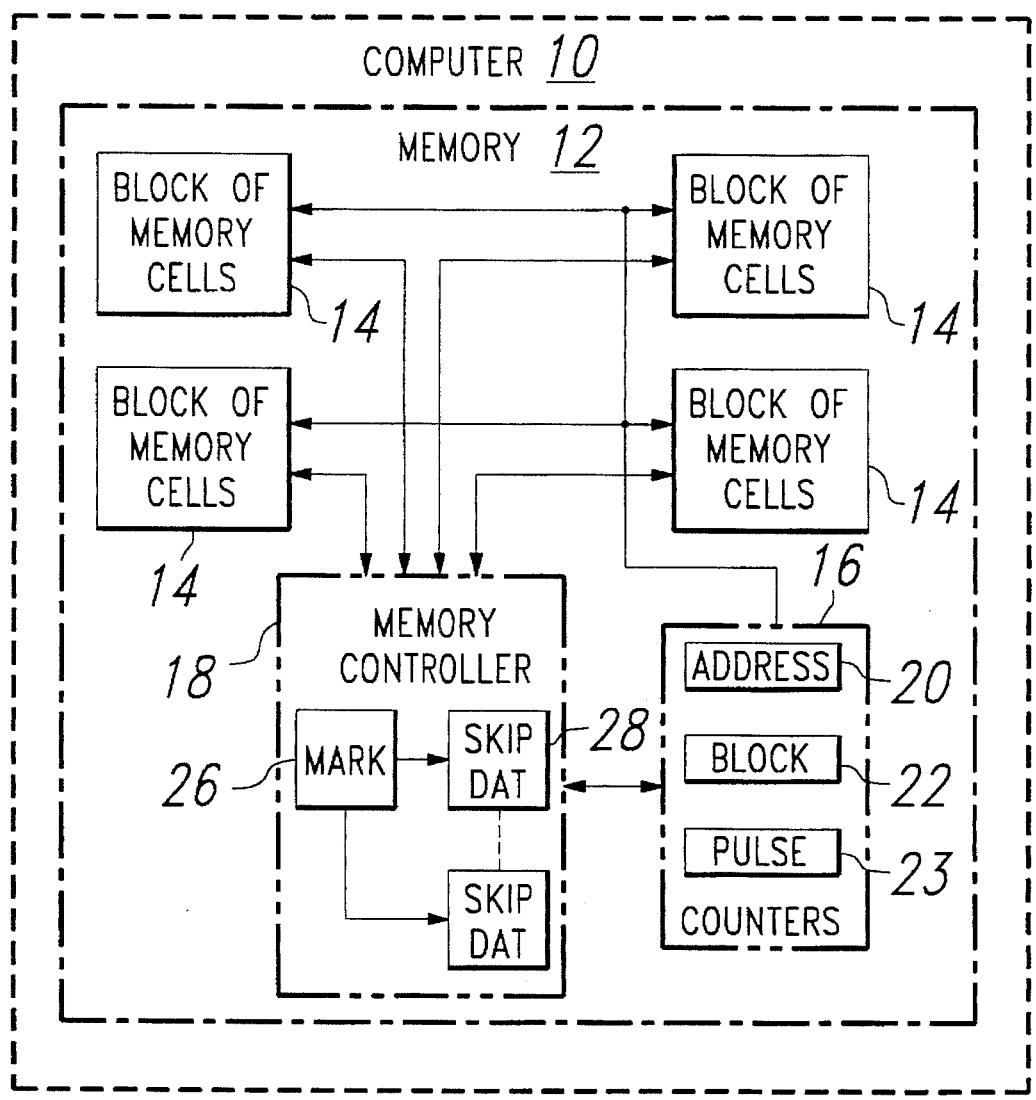
FIG. 1 is a block diagram of a computer according to the present invention, showing a memory controller which controls the blocks of memory cells.

FIG. 1 depicts a computer 10 containing a memory 12 which contains blocks 14 of memory cells, a counter 16, and a memory controller 18 conductively coupled to the counter 16 and the blocks 14 of memory cells. The counter 16 includes an address counter 20 which counts through the address space within each block 14, a block counter 22 which counts all the blocks 14, and a pulse counter 23 which counts program and erase pulses from the memory controller 18 to the blocks 14.

Figure 2:
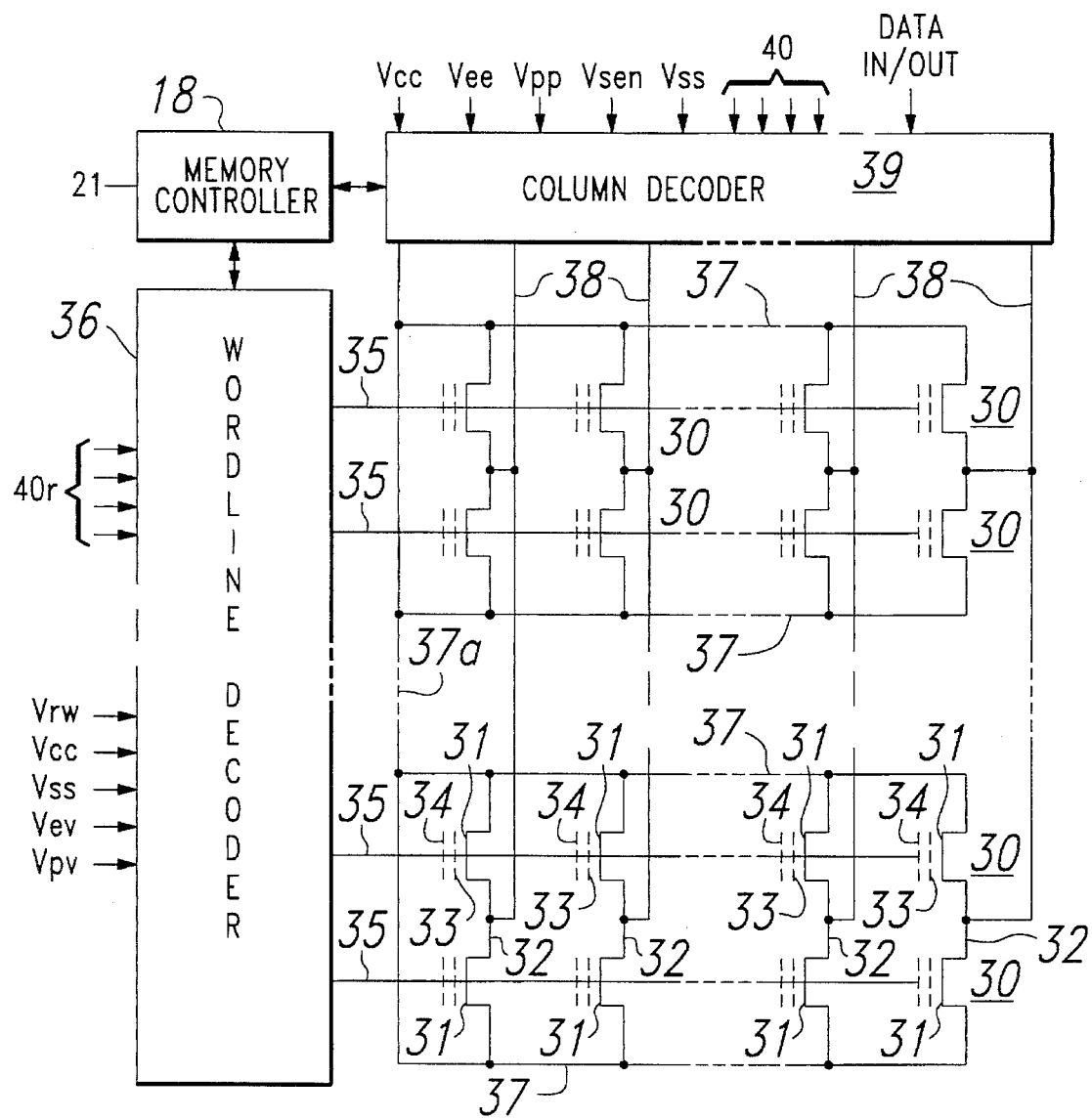
FIG. 2 is an electrical schematic diagram, in partial block form, of a block of memory cells.

The individual memory cells, shown as cells 30 in FIG. 2, are FAMOS (floating-gate avalanche metaloxide semiconductor) transistors. The memory controller 18 controls the erasing of the blocks 14 so that erasure is not attempted of blocks 14 that have already been erased. The memory controller 18 is also conductively coupled to a reference voltage generator (not shown), and controls the reference voltage which the generator sends to the blocks of memory cells. The memory controller 18 does not have to be part of the memory chip; rather, it could be separate from the chip. The memory controller 18 includes a mark latch 26, and, for each block 14, a skipdat latch 28 which registers the state of the block 14 of memory cells. The mark latch 26 indicates the status of the current operation on a memory block 14. In the preferred embodiment, multiple memory blocks 14 may be erased in parallel and each memory block 14 is verified one at a time, and a single mark latch 26 is shared by all the skipdat latches 28. In an alternate embodiment, multiple blocks are erased and verified in parallel, and a mark latch 26 is associated with each verify signal. The skipdat latch 28 functions as a flag register for a particular block 14, indicating to the memory controller 18 that the memory controller 18 should not erase that particular block 14.

Referring to FIG. 2, the memory controller and an example block of memory cells, which is an integral part of a memory chip, is shown for the purpose of illustrating use of the circuit of this invention. Each cell 30 is a floating-gate transistor having a source 31, a drain 32, a floating gate 33, and a control gate 34. Each of the control gates 34 in a row of cells 30 is connected to a wordline 35, and each of the wordlines 35 is connected to a wordline decoder 36. Each of the sources 31 in a row of cells 30 is connected to a source line 37. Each of the drains 32 in a column of cells 30 is connected to a drain-column line 38. Each of the source lines 37 is connected by a common-column line 37a to a column decoder 39 and each of the drain-column lines 38 is connected to the column decoder 39.

In a write or program mode, the wordline decoder 36 may function, in response to wordline address signals on lines 40r and to signals from the memory controller 18 (or microprocessor 18) to place a preselected first programming voltage Vrw (approx. +12 V) on a selected wordline 35, including a selected controlgate 34. Column decoder 39 also functions to place a second programming voltage Vpp (approx. +5 to +10 V) on a selected drain-column line 38 and, therefore, the drain 32 of selected cell 30. Source lines 37 are connected to reference potential Vss, which may be ground. All of the deselected drain-column lines 38 are connected to reference potential Vss or are floated. These programming voltages create a high current (drain 32 to source 31) condition in the channel of the selected memory cell 30, resulting in the generation near the drain-channel junction of channel-hot electrons and avalanche-breakdown electrons that are injected across the channel oxide to the floating gate 33 of the selected cell 30. The programming time is selected to be sufficiently long to program the floating gate 33 with a negative program charge of approximately −2 V to −6 V with respect to the channel region. For memory cells 30 fabricated in accordance with the preferred embodiment, the coupling coefficient between a control gate 34/wordline 35 and a floating gate 33 is approximately 0.6. Therefore, a programming voltage Vrw of 12 V, for example, on a selected wordline 35, including the selected control gate 34, places a voltage of approximately +7.2 V on the selected floating gate 33. The voltage difference between the floating gate 33 (at approx. +7.2 V) and the grounded (approx. 0 v) source line 37 is insufficient to cause a Fowler-Nordheim tunnelling current across the gate oxide between source 31 and floating gate 33 to charge the floating gate 33 of a selected or deselected cell 30. The floating gate 33 of the selected cell 30 is charged with hot electrons injected during programming, and the electrons in turn render the source-drain path under the floating gate 33 of the selected cell 30 nonconductive, a state which is read as a "zero" bit. Deselected cells 30 have source-drain paths under the floating gate 33 that remain conductive, and those cells 30 are read as "one" bits.

In a flash-erase mode, the column decoder 39 may function to leave all drain-column lines 38 floating. The wordline decoder 36 functions to connect all the wordlines 35 to reference potential Vss, which may be ground. The column decoder 39 also functions to apply a high positive voltage Vee (approx. +10 V to +15 V) to all the source lines 37. These erasing voltages create sufficient field strength across the gate oxide region to generate a Fowler-Nordheim tunnel current that transfers charge from the floating gate 33, erasing the memory cell 30. Since the potential on the wordline 35 is 0 V, the cell 30 remains in the nonconducting state during erase. For that reason, and also by reason of the fact that the drain 32 is floated, no channel-hot carriers are generated.

In a program verify mode, the wordline decoder 36 functions, in response to wordline address signals on lines 40r and to signals from memory controller 18, to apply a preselected positive voltage Vpv (approximately +7 V) to the selected wordline 35, and to apply a low voltage (ground or Vss) to deselected wordlines 35. The column decoder 39 functions to apply a preselected positive voltage Vsen (approx. +1 V) to at least the selected drain-column line 38 and to apply a low voltage (0 V) to the source line 37. The column decoder 39 also functions, in response to signal on address lines 40 d, to connect the selected drain-column line 38 of the selected cell 30 to the DATA IN/OUT terminal. The conductive or nonconductive state of the cell 30 connected to the selected drain-column line 38 and the selected wordline 35 is detected by a verify circuit (not shown) connected to the DATA IN/OUT terminal.

In an erase verify mode, the wordline decoder 36 functions, in response to wordline address signals on lines 40r and to signals from memory controller 18, to apply a preselected positive voltage Vev (approximately +V) to the selected wordline 35, and to apply a low voltage (ground or Vss) to deselected wordlines 35. The column decoder 39 functions to apply a preselected positive voltage Vsen (approx. +1 V) to at least the selected drain-column line 38 and to apply a low voltage (0 V) to the source line 37. The column decoder 39 also functions, in response to signal on address lines 40d, to connect the selected drain-column line 38 of the selected cell 30 to the DATA IN/OUT terminal. The conductive or nonconductive state of the cell 30 connected to the selected drain-column line 38 and the selected wordline 35 is detected by a verify circuit (not shown) connected to the DATA IN/OUT terminal.

In the read mode, the wordline decoder 36 functions, in response to wordline address signals on lines 40r and to signals from the memory controller 18, to apply a preselected positive voltage Vcc (approx. +5 V) to the selected wordline 35, and to apply a low voltage (ground or Vss) to deselected wordlines 35. The column decoder 39 functions to apply a preselected positive voltage Vsen (approx. +1 V) to at least the selected drain-column line 38 and to apply a low voltage (0 V) to the source line 37. The column decoder 39 also functions, in response to signal on address lines 40d, to connect the selected drain-column line 38 of the selected cell 30 to the DATA IN/OUT terminal. The conductive or nonconductive state of the cell 30 connected to the selected drain-column line 38 and the selected wordline 35 is detected by a sense amplifier (not shown) connected to the DATA IN/OUT terminal.

For convenience, a table of read, write, and erase voltages for a block 14 of memory cells is given in TABLE 1 below:

TABLE 1

|  | Read | Write | Erase | Pv | Ev |
| --- | --- | --- | --- | --- | --- |
| Selected Wordline | 5v | 12v | 0v (All) | 7v | 3v |
| Deselected Wordlines | 0v | 0v | — | 0v | 0v |
| Selected Drain Line | 1v | 5–10v | Float (All) | 1.0v | 1.0v |
| Deselected Drain Lines | 0v/Float | 0v/Float | — | 0V/Float | 0V/Float |
| Source Lines | 0v | –0v | 10–15v (All) | 0v | 0v |

TABLE 1-continued

| Read | Write | Erase | Pv | Ev |
| --- | --- | --- | --- | --- | where Pv = program verify mode, and Ev = erase verify mode

Figure 3:
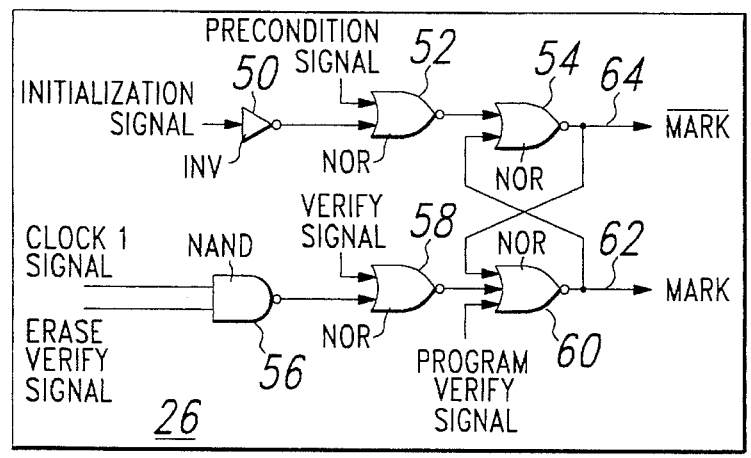
FIG. 3 is a block diagram of a mark latch, part of the memory controller.

Referring now to FIG. 3, the mark latch 26 includes an inverter 50 which receives an address initialization signal (AINI) from the memory controller 18. The AINI signal initializes the address counter 20 to a first address and, depending on the requested operation, initializes the block counter 22 to a first block. The output of the inverter 50 is connected to the input o a NOR gate 52. The other input of the NOR gate receives a precondition signal ("PRECOND") from the memory controller 18. The PRECOND signal indicates whether the precondition portion of the erase algorithm of the present invention has been selected. The output of the NOR gate 52 is connected to the input of a NOR gate 54.

The mark latch 26 also receives an input signal CLK1, which is a clock signal from a synchronous clock (not shown) on the memory 12. The mark latch 26 also receives an input signal ERVER, which is an erase verify signal from the memory controller 18. The ERVER signal indicates that an erase verify operation has been selected. The CLK1 and the ERVER signals are inputs to a NAND gate 56. The output of the NAND gate 56 is connected to the input of a NOR gate 58. The other input to the NOR gate 58 is an input signal to the mark latch 26, a VERIFY signal. The VERIFY signal is received from the memory controller to indicate that the addressed byte has been programmed or erased, depending on which was requested. The output of the NOR gate 58 is connected to the input of a NOR gate 60. Another input to the NOR gate 60 is the PGMVER input signal to the mark latch 26. The PGMVER signal is generated by the memory controller 18 and indicates that a program verify has been requested and resets the mark latch 26 low.

Another input to the NOR gate 60 is the output of the NOR gate 54. Similarly, the second input to the NOR gate 54 is the output of the NOR gate 60. Thus, the two NOR gates, 54 and 60, function as a latch. The mark latch output line 62, having a MARK output, when high, indicates that a block has already been erased. The MARK output 62 will be high whenever there is an address initialization (AINI) except in preconditioning. During preconditioning the mark latch 26 is reset by PGMVER. Any programming will also reset the MARK output on line 62 by PGMVER.

Figure 4:
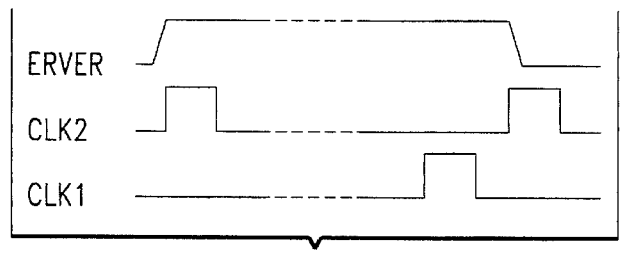
FIG. 4 is a timing diagram for the erase verify mode of the mark latch.

Referring now to FIG. 4, the timing for the erase verify mode of the mark latch is shown. The MARK output on line 62 will be reset at the end of the erase verify pulse (ERVER) if there is any erase verify failure. The MARK output on line 62 will remain set high if the erase operation was successful. The VERIFY signal in FIG. 3 is valid by the rising edge of CLK1.

According to the present invention, in the memory controller 18, there is a skipdat latch 28 assigned to each block 14, whose state depends on whether the block is erased. The skipdat latch 28 will be set: (1) if the block 14 is in an erased state; or (2) if the block 14 has been secured to prevent the block from being modified. If a block has been secured, it cannot be changed. If a block erase/program operation is attempted on a secured block, the memory controller 18 ensures that the operation is skipped. "Secure" information can be stored in volatile latches or in nonvolatile cells such as FAMOS cells or both.

Figure 5:
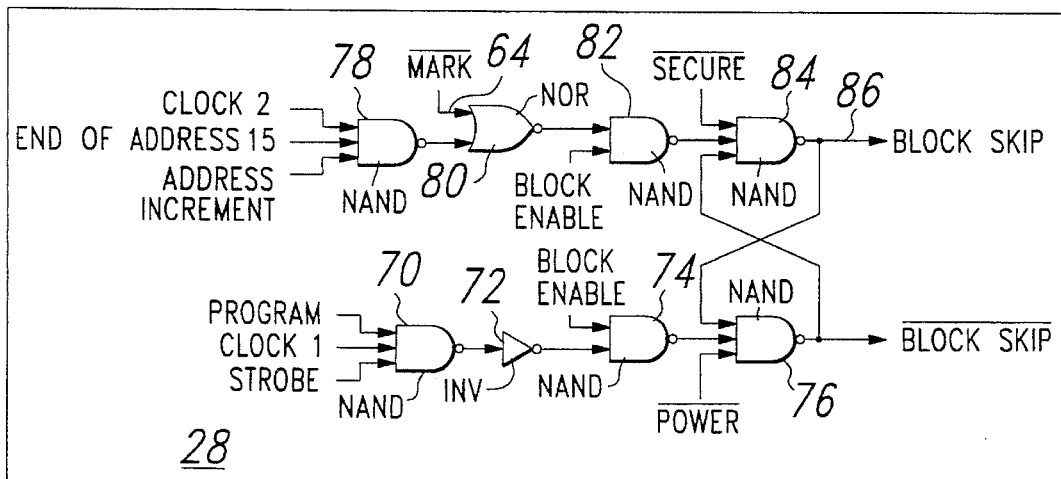
FIG. 5 is a block diagram of a skipdat latch, part of the memory controller.

Referring now to FIG. 5, the skipdat latch 28 receives the CLK1 signal, described above, as one of the inputs to a NAND gate 70. Another input to the NAND gate 70 is a PGM signal, which the memory controller generates to indicate that a program operation is requested. A third input to the NAND gate 70 is a STROBE signal, which the memory clock generates to indicate the first clock pulse of a memory operation. The output of the NAND gate 70 is inverted by an inverter 72, and the inverted signal is an input to a NAND gate 74. The other input to the NAND gate 74 is a block enable ("BLKEN") signal, which indicates that a particular block has been selected by the block counter 22 for a program/erase operation. The output of the NAND gate 74 is an input to a NAND gate 76. A second input to the NAND gate 76 is the POR signal, which is generated by the memory to indicate that the memory has just received power.

A NAND gate 78 receives three input signals to the skipdat latch. An AINC input signal is an address increment signal generated by the memory controller 18 for incrementing the address counter 20. The input signal EOA15 is generated by the address counter 20 and indicates the last memory cell within a block has been addressed. The input signal CLK2 is generated by the synchronous clock on the memory, and does not overlap the CLK1 signal. The output of the NAND gate 78 is connected to a NOR gate 80. The other input signal to the NOR gate 80 is the MARK signal, which indicates that the block 14 has been erased. The output of the NOR gate 80 is connected to a NAND gate 82. The other input to the NAND gate 82 is the BLKEN signal. The output of the NAND gate 82 is connected to a NAND gate 84. Another input to the NAND gate 84 is the SECURE signal, generated by the memory controller 18, and indicates that the block 14 is not to be erased. The NAND gate 84 also receives as an input the output of the NAND gate 76, and similarly, the NAND gate 76 receives as in input the output of the NAND gate 84. Thus, the NAND gates 76 and 84 function as a latch. The output of the NAND gate 84 on an output line 86 is SKIPDAT, which indicates that the associated block 14 should not be erased.

Figure 6:
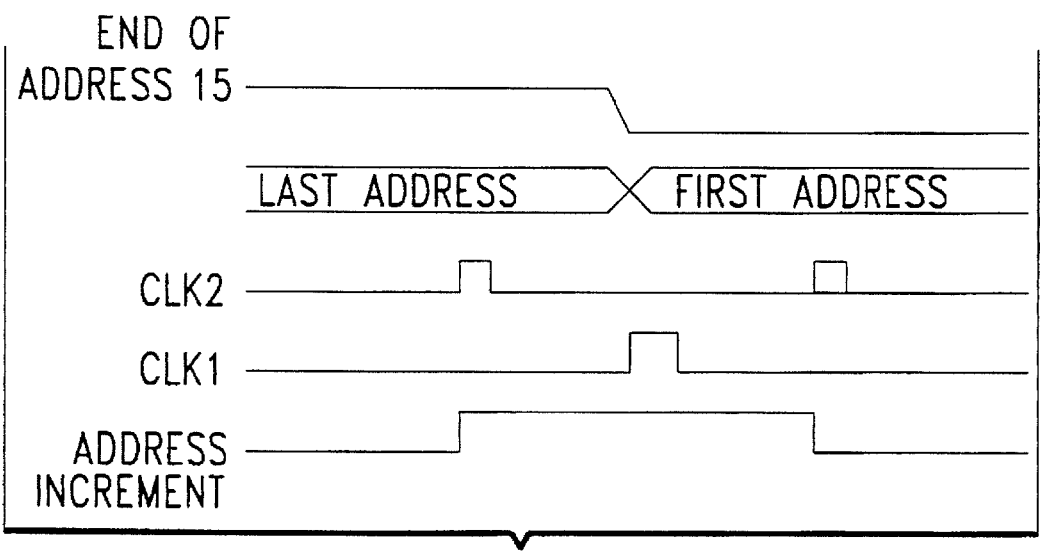
FIG. 6 ms a timing diagram for setting the skipdat latch high.

Referring now to FIG. 6, the timing for setting the SKIPDAT output on line 86 to high is shown. When the AINC, the CLK2, and the EOA15 signals are high, the address counter is at the last address of a block. At this point in time, the output line 64 of the mark latch 26, containing the signal MARK passes this information to the SKIPDAT latch 28, to the NOR gate 80. If the whole block has passed erase verification, MARK will still stay at high and make SKIPDAT high. SKIPDAT will be forced high by SECURE all the time if the block is secured. Otherwise, SKIPDAT will be low.

Figure 7:
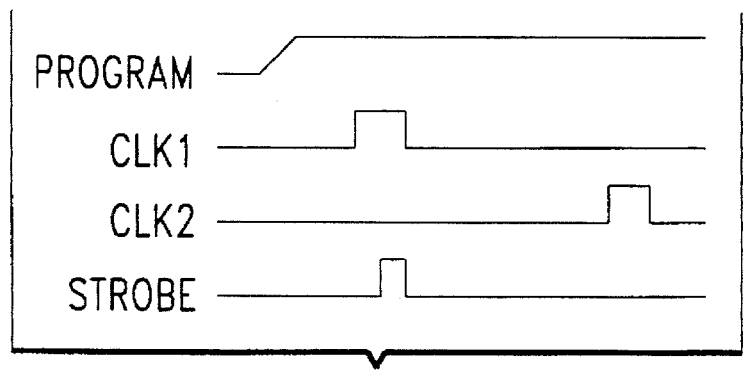
FIG. 7 is a timing diagram for resetting the skipdat latch low.

Referring now to FIG. 7, the timing for resetting the SKIPDAT output on line 86 to low is shown. SKIPDAT is reset at the beginning of the program operation, when PGM, CLK1, and STROBE are high, for programming an unsecured block. SKIPDAT latch is reset during power-on reset (POR).

Figure 8:
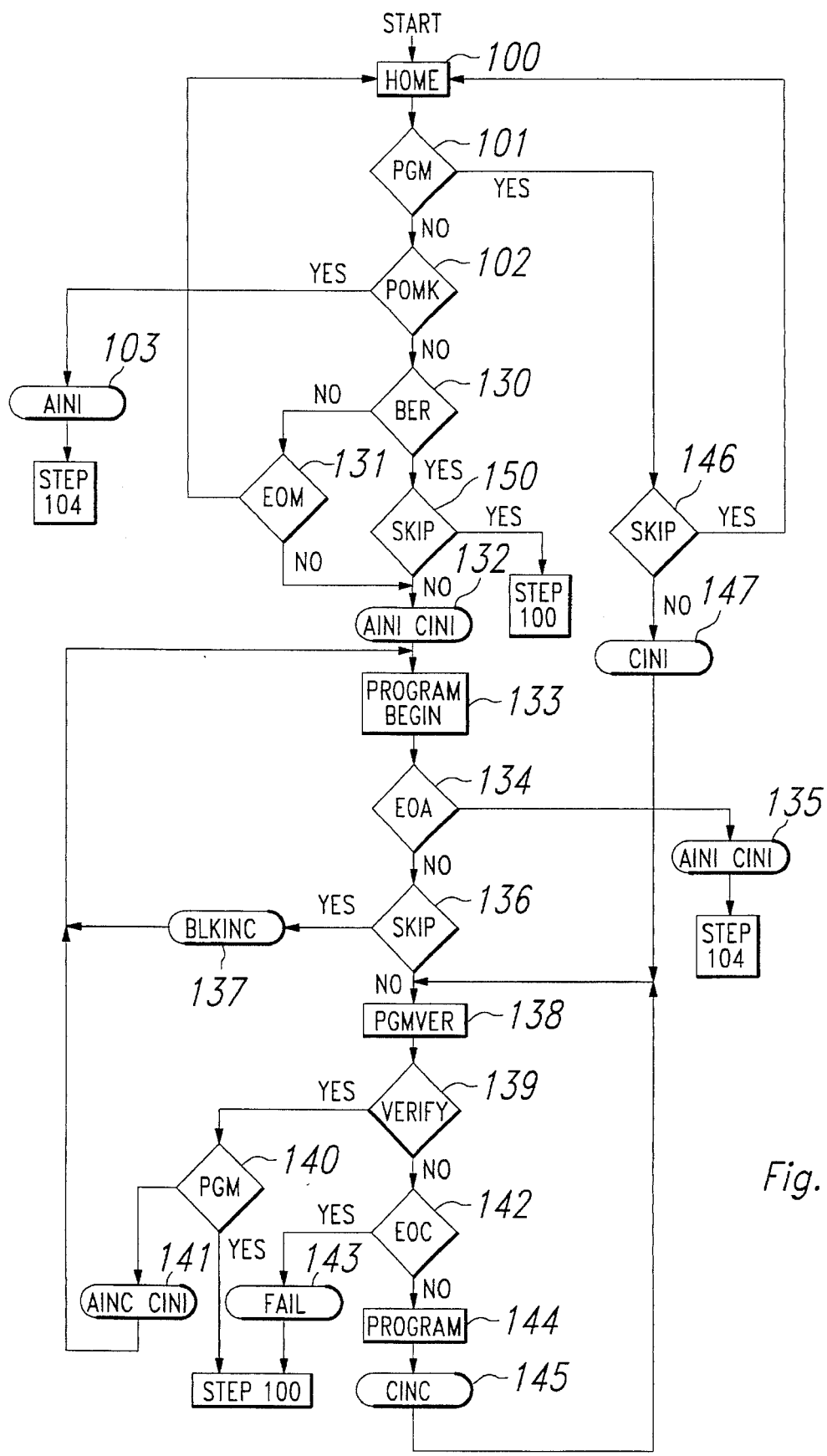
FIG. 8 is a flow diagram showing the method of the present invention whereby the memory controller interprets computer commands, and programs and preconditions blocks of memory cells for erasure.
Figure 9:
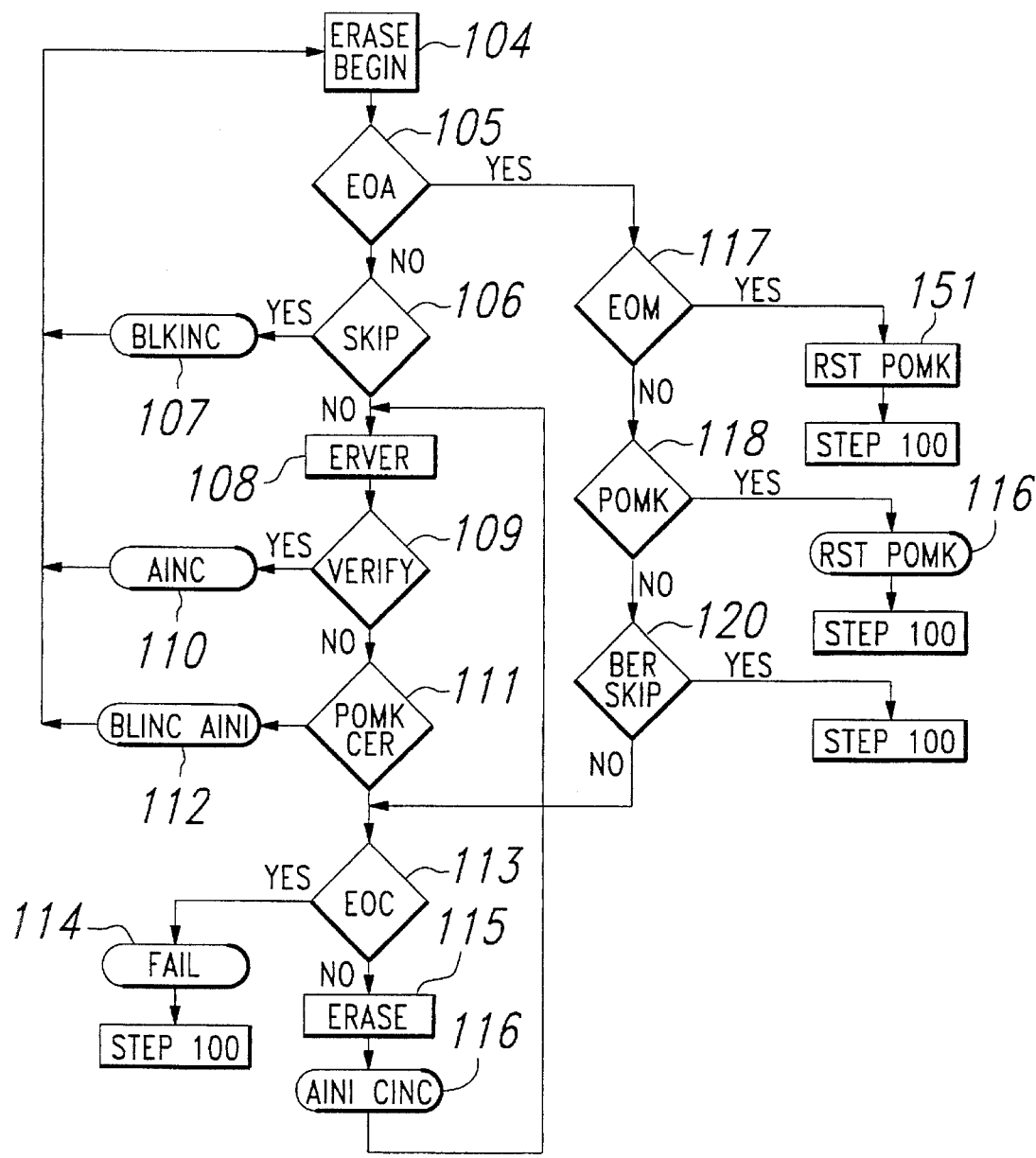
FIG. 9 is a flow diagram showing the method of the present invention whereby the memory controller erases or verifies the erasure of a selected block or blocks of memory cells.

The following abbreviations are used in the flow charts of FIGS. 8 and 9, which are flow charts showing the method of the present invention.

| | |
| --- | --- |
| AINC → | Increment Address Counter |
| AINI → | Address Initialization, "AINI" output initializes either the address counter or both the address counter and the block counter, depending on signals "CER", "POMK", "BER", and "BLKINC". |
| BER → | Block Erase |

| | |
|---|---|
| BLKINC → | Increment Block Address |
| CER → | Chip Erase |
| CINC → | Increment Pulse Counter |
| CINI → | Initialize Pulse Counter |
| EOA → | End of Address Counter (For chip erase, or POMK, "EOA" refers to the whole array, and for Block Erase, "EOA" refers to the block.) |
| EOC → | End of Pulse Count |
| EOM → | All the blocks are marked. Means all blocks are in erased state/secured. |
| FAIL → | Fail to erase or program, depending on operation. |
| PGM → | Program Operation |
| POMK → | Power-Up Mark |
| RSTPOMK → | Reset "POMK" Latch |
| SKIP → | Skip the Block |
| STATES: | HOME, S0, S1, PGMVER (Program Verification), ERVER (Erase Verification), PROGRAM, ERASE. |
| VERIFY → | Result of erase/program verification. It is "high" if byte/word is erased or programmed, depending on erase verification or program verification. |

Referring now to FIG. 8, part of the method of the present invention is shown, whereby the memory controller interprets computer commands, and programs and preconditions blocks of memory cells for erasure. In step 100, the memory controller is in a home state, waiting for a command from the computer to read, write, or erase memory cells. In step 101, the memory controller decides if the computer has requested a PGM (program) operation. If the computer has not requested a program operation, then in step 102 the memory controller examines a latch POMK to determine if an erase command is the first non-program command after power-up. If so, then in step 103 the memory controller initializes the address counter 20, the block counter 22, and sets the mark latch 26.

Referring now to FIG. 9, the memory controller erases or verifies the erasure of a selected block or blocks of memory cells. In step 104, the memory controller is in an erase begin state. In step 105, the memory controller determines if the address counter has reached the last address of the last block. If it has not, then in step 106, the memory controller determines, by examining the skipdat latch 28, if (a) the block is secure, or (b) the block has been previously erased. If either condition (a) or (b) exists, then in step 107, the memory controller increments the block counter and returns to step 104.

If in step 106 the block was not secure, and if this is the first erase operation after power-up, then the memory controller in step 108 executes an erase verify mode operation. In step 109 the memory controller checks the results of step 108 to determine if the address location addressed by the address counter 20 has been erased. Referring again to FIGS. 3 and 4, at this step 109 the output line 62 remains high if the block has been erased, but if the address location within the block is not erased, then output line 62 is low and output line 64 is high. If the address location has been erased, then in step 110 the address counter is incremented, and the memory controller 18 returns to step 104. If the address location has not been erased, then in step 111, the memory controller determines if it is the first erase operation after initial power-up, or if the computer has requested erasure of the entire chip. If so, then in step 112 the memory controller increments the block counter 22, initializes the address counter 20 to the first address, resets the mark latch 26, and returns to step 104.

If in step 111, the memory controller 18 determines that it is not the first erase operation after initial power-up that has been requested, and the computer has not requested erasure of the entire chip, then in step 113 the memory controller determines if a predetermined maximum erase pulse count has been exceeded by the pulse counter 23. If the maximum has been exceeded, then in step 114 the memory controller sets a fail indication register, and returns to step 100. In step 100 the memory controller 18 terminates the present command and waits for the next valid command from the computer. If the maximum has not been exceeded, then in step 115 the memory controller 18 generates a flash erase mode pulse. If the computer requested erasure of the entire chip, all unsecured and unerased memory blocks 14 receive the erase pulse in parallel. If the computer has requested erasure of a single memory block 14, only that block 14 receives an erase pulse. Then, in step 116, the memory controller initializes the address counter 20 to the first address, increments the pulse counter used in step 113, and then returns to step 108. Thus, as is commonly known in the art, the block is erased in iterative erase steps, via the steps 108, 109, 111, 113, 115, and 116. The method of the present invention allows erasure of all blocks 14 in parallel, disabling erasure on a block 14 once the block 14 has passed erase verification, and prevents over-erasure of a memory block 14 if a differing memory block 14 requires more erase pulses.

Referring back to step 105, if the last address of the last block 14 has been reached in a chip erasure operation, or if the last address of a single block has been reached in a block erasure, then the memory controller in step 117 determines if the erase operation of steps 106 through 116 has been successful. That is, if all skipdat latches 28 are set, then the memory controller proceeds to step 151. In step 151, a POMK latch is reset to indicate to the memory controller that for each memory block, that memory block's erase status has been stored in the corresponding skipdat latch. The memory controller then returns to step 100. In step 100 the memory controller 18 terminates the present command and waits for the next valid command from the computer. If any skipdat latch 28 is not set, then in step 118, the memory controller determines if an erase command is the first non-program command after power-up. If it is, then in step 119 the POMK latch is reset, and the memory controller 18 returns to step 100 and does not wait for a command from the computer, but rather it executes the requested erase operation.

If not, then in step 120 the memory controller determines if erasure of only a single block was requested, and if the corresponding SKIPDAT signal on line 86 is high. If both of these conditions are met, then the memory controller returns to step 100. In step 100 the memory controller 18 terminates the present command and waits for the next valid command from the computer. If not, then the memory controller returns to step 113.

Referring now to FIG. 8, and step 102, the memory controller examines a latch POMK to determine if an erase command is the first non-program command after power-up. If not, then in step 130 the memory controller determines if erasure of only a single block has been requested. If not, then in step 131 the memory controller determines if all SKIPDAT signals on all output lines 86 are high. If they are all high, then the memory controller returns to step 100. In step 100 the memory controller 18 terminates the present command and waits for the next valid command from the computer. If they are not all high, then in step 132 the memory controller initializes the address counter 20 and conditionally the block counter 22 to the first address, and initializes the pulse counter 23 to zero. Then, the memory controller proceeds to step 133, in which the memory controller is in an program begin state. Then, in step 134, the memory controller determines if the address counter has reached the last address of the last block 14 in a chip erasure operation, or if the last address of a single block has been reached in a block erasure. If so, then the memory controller in step 135 initializes the address counter 20 to the first address, initializes the pulse counter 23 to zero, and proceeds to step 104.

If the last address of the last block has not been reached in a chip erasure operation, or if the last address of a single block has not been reached in a block erasure, then in step 136 the memory controller determines if (a) the block is secure, or (b) the block has been previously erased. If either condition (a) or (b) exists, then in step 137 the memory controller increments the block counter 22, and returns to step 133.

If those conditions examined in step 136 do not exist, then in step 138 the memory controller executes a program verify mode operation. Then in step 139 the memory controller determines if the address location addressed by the address counter has been programmed. If it has been programmed, then in step 140 the memory controller determines if the prior command was a program or an erase command (issued by the computer while in step 100). If the prior command was a program command, then the memory controller returns to step 100. In step 100 the memory controller 18 terminates the present command and waits for the next valid command from the computer. If it was not a program command, then in step 141 the memory controller increments the address counter 20, initializes the pulse counter 23 to zero, and returns to step 133.

If in step 139 the memory controller determines that the address location addressed by the address counter does not pass the program verify operation, then in step 142 the memory controller determines if a predetermined maximum program pulse count has been exceeded, as counted by the pulse counter 23. If the maximum has been exceeded, then in step 143 the memory controller sets a fail indication register, and returns to step 100. In step 100 the memory controller 18 terminates the present command and waits for the next valid command from the computer. If the maximum has not been exceeded, then in step 144 the memory controller generates a flash program mode pulse to program the address location. Then in step 145 the memory controller increments the pulse counter 23, and returns to step 138. Thus, as is commonly known in the art, the address location is programmed in iterative program steps, via the steps 138, 139, 142, 144, and 145.

Referring back to step 130, if the memory controller determines that erasure of a single block has been requested, the memory controller proceeds to step 150. In step 150, the SKIPDAT signal of the addressed block is examined. If the SKIPDAT signal indicates the addressed block is erased or secure, the memory controller returns to step 100. In step 100 the memory controller 18 terminates the present command and waits for the next valid command from the computer. If the addressed block is not secure and not erased, the memory controller proceeds to step 132.

Referring back to step 101, the memory controller decides if the computer has requested a PGM (program) operation. If the computer has requested a program operation, then in step 146 the memory controller determines if the block has been previously secured. If the block has been secured, then the memory controller returns to step 100. In step 100 the memory controller 18 terminates the present command and waits for the next valid command from the computer. If it has not been secured, then in step 147 the memory controller initializes the pulse counter 23 to zero, and goes to step 138.

Referring now to both FIGS. 8 and 9, the method of the present invention may be summarized as follows. Upon power-up, the first erase command will cause the memory controller to first enter an erase verification cycle, scan every block in the memory, and set the skipdat latches 28 corresponding to blocks which are found to have been erased or secured.

After erase verification, only the blocks whose skipdat latches 28 are not set will undergo preconditioning and erase. Each erase pulse is followed by erase verification, and as soon as a block is verified to be erased, its corresponding skipdat latch 28 is set so that it will not receive any further erase pulses. Except for the first erase command after power-up, no erase verification is done prior to erase preconditioning. The erase preconditioning is followed by the sequence erase, erase verification, erase, erase verification, and so on, until all the skipdat latches 28 are set or the number of erase pulses applied exceed a certain limit.

Program operation resets the skipdat latch 28 of an addressed block which is not secured. The skipdat latch 28 of a block which is erased remains set until program operation is performed on the block. If erase operation is attempted on a block which is already in erased state, the operation will be skipped (no verification, no preconditioning, no erase pulses).

The principles, preferred embodiments, and modes of operation of the present invention have been described in the foregoing specification. The invention is not to be construed as limited to the particular forms disclosed, because these are regarded as illustrative rather than restrictive. Moreover, variations and changes may be made by those skilled in the art without departing from the spirit of the invention.

What is claimed is:

1. A non-volatile memory fabricated on a silicon substrate, the memory having blocks of memory cells, means for programming the cells, means for erasing the blocks, means for securing the blocks against erasure, means for detecting whether a block is in an erased state or in a state secured from erasure, and a memory controller for controlling the programming, erasing, securing, and detecting means, the memory further comprising:

(a) a mark latch for each block, each mark latch responsive to signals from the means for detecting, for generating a MARK signal indicating if its respective block has been erased, each mark latch comprising: first and second NOR gates responsive to signals from the means for detecting, the output of the first NOR gate connected to an input of the second NOR gate, and the output of the second NOR gate connected to an input of the first NOR gate; and (b) a secure latch for each block, each secure latch responsive to signals from the means for detecting, for generating a SKIPDAT signal indicating if its respective block has been secured against erasure, each secure latch comprising: first and second NAND gates responsive to signals from the means for detecting, the output of the first NAND gate connected to an input of the second NAND gate, and the output of the second NAND gate connected to an input of the first NAND gate.

2. The memory of claim 1, wherein the memory controller generates a program verify signal indicating that a program verify has been requested, a precondition signal to indicate that a block is under erase precondition, and a verify signal indicating that a block has been erased, and the mark latch of each respective block further comprises a third NOR gate having its output connected to an input of the first NOR gate, and a fourth NOR gate having its output connected to an input of the second NOR gate, and wherein the second NOR gate receives as an input the program verify signal, the third NOR gate receives as an input the precondition signal, and the fourth NOR gate receives as an input the verify signal.

3. The memory of claim 1, wherein the memory generates a $\overline{\text{SECURE}}$ signal indicating that a selected block is not to be erased, a program signal indicating that a program operation has been requested, a $\overline{\text{POR}}$ signal indicating that the memory has just received power, and a BLKEN signal indicating that a block has been selected for an program/erase operation, and the secure latch of each respective block further comprises a third NAND gate having its output connected to an input of the first NAND gate, and a fourth NAND gate having its output connected to an input of the second NAND gate, and wherein the first NAND gate receives as an input the $\overline{\text{SECURE}}$ signal, the second NAND gate receives as an input the $\overline{\text{POR}}$ signal, and the third and fourth NAND gates each receives as an input the BLKEN signal.

4. The memory of claim 1, further comprising means for verifying that the selected blocks have been erased.

5. The memory of claim 1, further comprising means for resetting the flag register for each block which, after erasure, is programmed with information.

\* \* \* \* \*